(12) United States Patent
Brush et al.

(10) Patent No.: US 6,215,168 B1
(45) Date of Patent: Apr. 10, 2001

(54) DOUBLY GRADED JUNCTION TERMINATION EXTENSION FOR EDGE PASSIVATION OF SEMICONDUCTOR DEVICES

(75) Inventors: Linda Susan Brush, Mountaintop; John Mannine Savidge Neilson, Norristown, both of PA (US)

(73) Assignee: Intersil Corporation, Palm Bay, FL (US)

( * ) Notice: Subject to any disclaimer, the term of this patent is extended or adjusted under 35 U.S.C. 154(b) by 0 days.

(21) Appl. No.: 09/358,625

(22) Filed: Jul. 21, 1999

(51) Int. Cl.$^7$ .............................. H01L 23/58; H01L 29/76
(52) U.S. Cl. ...................... 257/494; 257/490; 257/495; 257/341
(58) Field of Search ........................... 257/594, 495, 257/494, 490, 492, 493, 341

(56) References Cited

U.S. PATENT DOCUMENTS

| | | |
|---|---|---|
| 4,648,174 | 3/1987 | Temple et al. ........................ 257/494 |
| 4,667,393 | 5/1987 | Ferla et al. ........................... 257/494 |
| 4,927,772 | 5/1990 | Arthur et al. ......................... 257/494 |
| 5,712,502 | 1/1998 | Mitlehner et al. .................... 257/341 |

*Primary Examiner*—Steven Loke
(74) *Attorney, Agent, or Firm*—Jaeckle Fleischmann & Mugel, LLP

(57) ABSTRACT

A silicon semiconductor die comprises a heavily doped silicon substrate and an upper layer comprising doped silicon of a first conductivity type disposed on the substrate. The upper layer includes an active region that comprises a well region of a second, opposite conductivity type and an edge passivation zone comprising a junction termination extension (JTE) JTE region that includes portions extending away from and extending beneath the well region. The JTE region is of varying dopant density, the dopant density being maximum at a point substantially directly beneath the junction at the upper surface of the upper layer of the JTE region with the well region. The dopant density of the JTE region decreases in both lateral directions from its maximum point, becoming less in both the portions extending away from and beneath the well region.

11 Claims, 4 Drawing Sheets

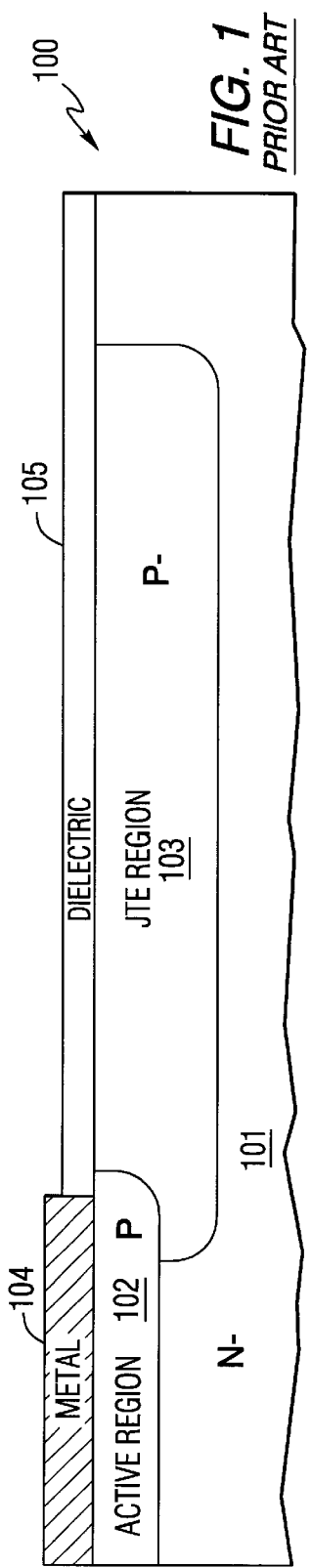
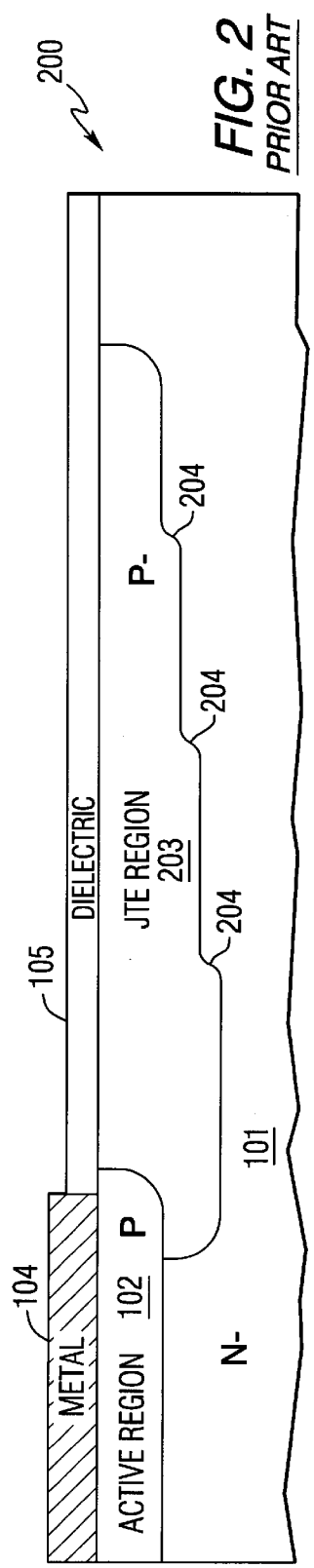
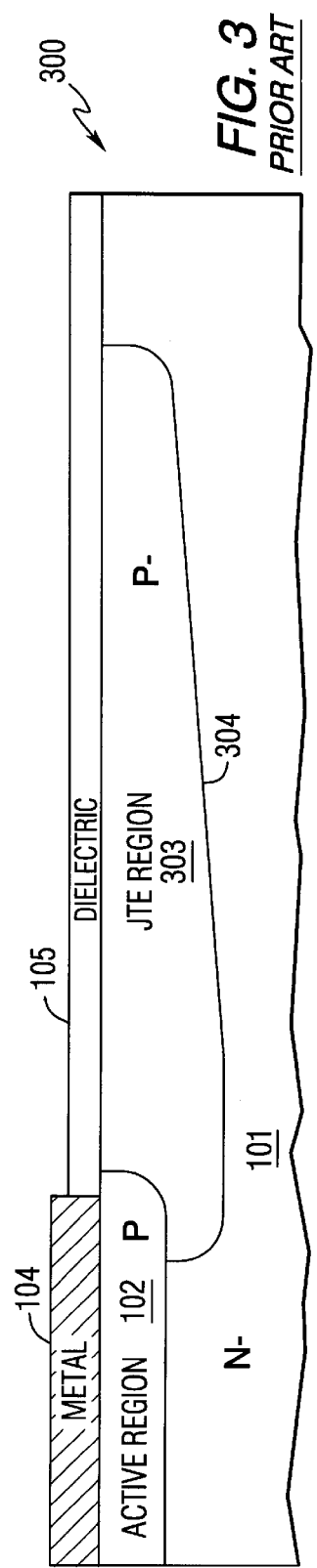

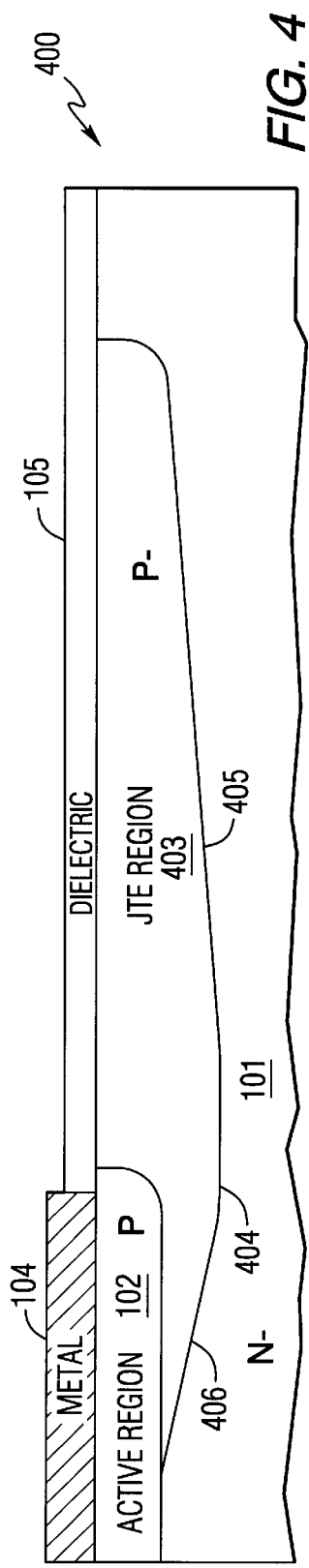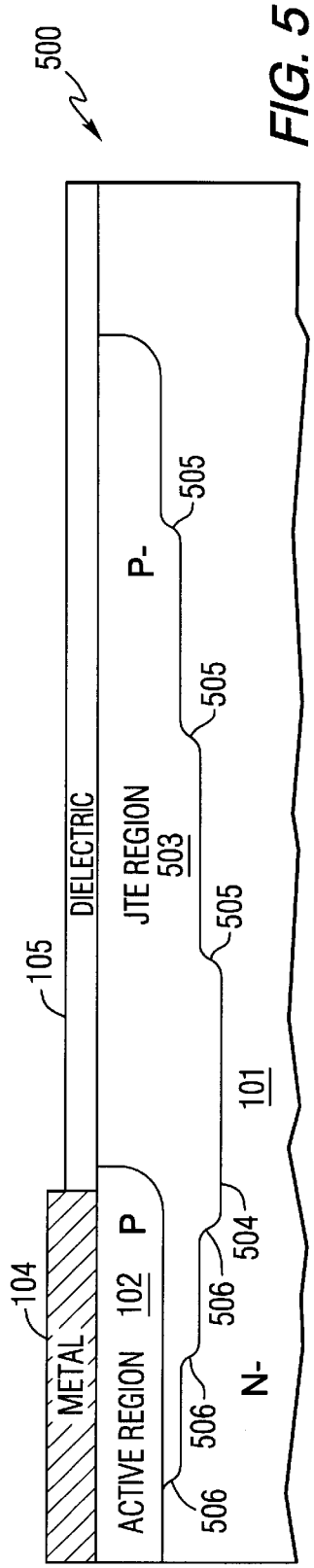

DOUBLY GRADED JUNCTION TERMINATION EXTENSION FOR EDGE PASSIVATION OF SEMICONDUCTOR DEVICES

FIELD OF THE INVENTION

The present invention relates to silicon power semiconductor devices and, more particularly, to a device having improved edge passivation.

BACKGROUND OF THE INVENTION

Protection of device edges, where the region of the device makes the transition from its internal structure to its external structure, is an essential aspect of the design of high voltage semiconductor devices such as MOSFETs, IGBTs, MCTs, bipolar transistors, thyristors, and diodes. The edge protection, or edge passivation structure, must perform the function of distributing the applied voltage over a wider region on the surface of the device than it occupies within the silicon substrate, thereby ensuring that the electric field at the surface is low enough to prevent arcing outside the silicon substrate or avalanche breakdown within the substrate near its surface.

In producing a P-N junction diode by a typical planar diffusion technique, a cylindrical junction is formed by diff-using a dopant through an oxide window. Because of the curvature at the edge of the junction, it produces a greater electric field than an ideal planar junction. As a result, the breakdown voltage of a cylindrical junction diode is substantially lower than an ideal planar junction diode.

Junction termination extension (JTE) is an edge passivation technique for reducing the concentration of the electric field in a cylindrical junction diode. To support the applied voltage at the surface, a JTE region is characterized by a dopant charge per unit area sufficiently low to allow the field to spread all the way, or most of the way, through the region prior to the onset of avalanche breakdown. The optimum dopant density per unit area for such a region is of the order of $1\times10^{12}$ to $1\times10^{13}$ per square centimeter, which approximates the maximum charge per unit area that a JTE region can contain prior to the onset of avalanche breakdown. Too low a density will allow the region to deplete at a field too low to support adequate voltage; too high a density will cause the depletion region to be too thin to support adequate voltage. JTE is described in, for example, V. A. K. Temple, "Junction termination extension, a new technique for increasing avalanche breakdown voltage and controlling surface electric field in p-n junction," IEEE *International Electron Devices Meeting Digest*. 1977, Abstract 20.4, pp 423–426, the disclosure of which is incorporated herein by reference.

U.S. Pat. No. 5,712,502 to Mitlehner et al., the disclosure of which is incorporated herein by reference, describes a semiconductor device that includes an active area, a depletion zone whose vertical extension is at a maximum beneath the active area, and a junction termination whose lateral extension is greater than the maximum vertical extension of the depletion zone.

U.S. Pat. No. 4,927,772 to Arthur et al., the disclosure of which is incorporated herein by reference, describes a method of making a high voltage semiconductor device using two masks that enable the formation of a graded multiple-zone JTE region and a graded multiple zone P+ region.

U.S. Pat. No. 4,667,393 to Ferla et al., the disclosure of which is incorporated herein by reference, describes a method for making a high voltage semiconductor device having a stepped continuous JTE zone formed by implanting and diffusing decreasing concentrations of a dopant through a series of mask apertures prior to forming emitter and channel stop regions and metal emitter, base, and collector contacts.

U.S. Pat. No. 4,648,174 to Temple et al., the disclosure of which is incorporated herein by reference, describes a process of forming a semiconductor that includes a multiplezone junction termination region adjacent a reverse-blocking junction.

FIGS. 1, 2, and 3 schematically illustrate several known JTE structures. In FIG. 1, the dopant density in the JTE region is depicted as constant, and in FIG. 2 it is shown as decreasing in discrete steps with increasing distance from the active region. The JTE structure of FIG. 3 is similar to that of FIG. 2, except that the dopant density decreases in a smooth gradient. A stepped or graded density, as shown in FIGS. 2 and 3, is more tolerant of variations in dopant density than the constant-density situation of FIG. 1.

Finding an improved way to reduce the electric field at the active area-JTE junction of a power semiconductor device and thereby increase its breakdown volta e remains a highly desirable goal, one that is realized in the present invention.

SUMMARY OF THE INVENTION

The present invention is directed to a silicon semiconductor die that comprises a heavily doped silicon substrate and an upper layer comprising doped silicon of a first conductivity type disposed on the substrate. The upper layer includes an active region that comprises a well region of a second, opposite conductivity type and an edge passivation zone comprising a junction termination extension (JTE) JTE region that ji includes portions extending away from and extending beneath the well region. The JTE region is of varying dopant density, the dopant density being maximum at a point sub. tantially directly beneath the junction at the upper surface of the upper layer of the JTE region with the well region. The dopant density of the JTE region decreases in both lateral directions from its maximum point, lessening in both the portions extending away from and beneath the well region.

BRIEF DESCRIPTION OF THE DRAWINGS

FIGS. 1, 2, and 3 schematically depict silicon semiconductor dies that include junction termination extension structures known in the prior art.

FIGS. 4 and 5 illustrate semiconductor dies that include doubly graded junction termination extension structures in accordance with the present invention.

DETAILED DESCRIPTION OF THE INVENTION

Figure 6:
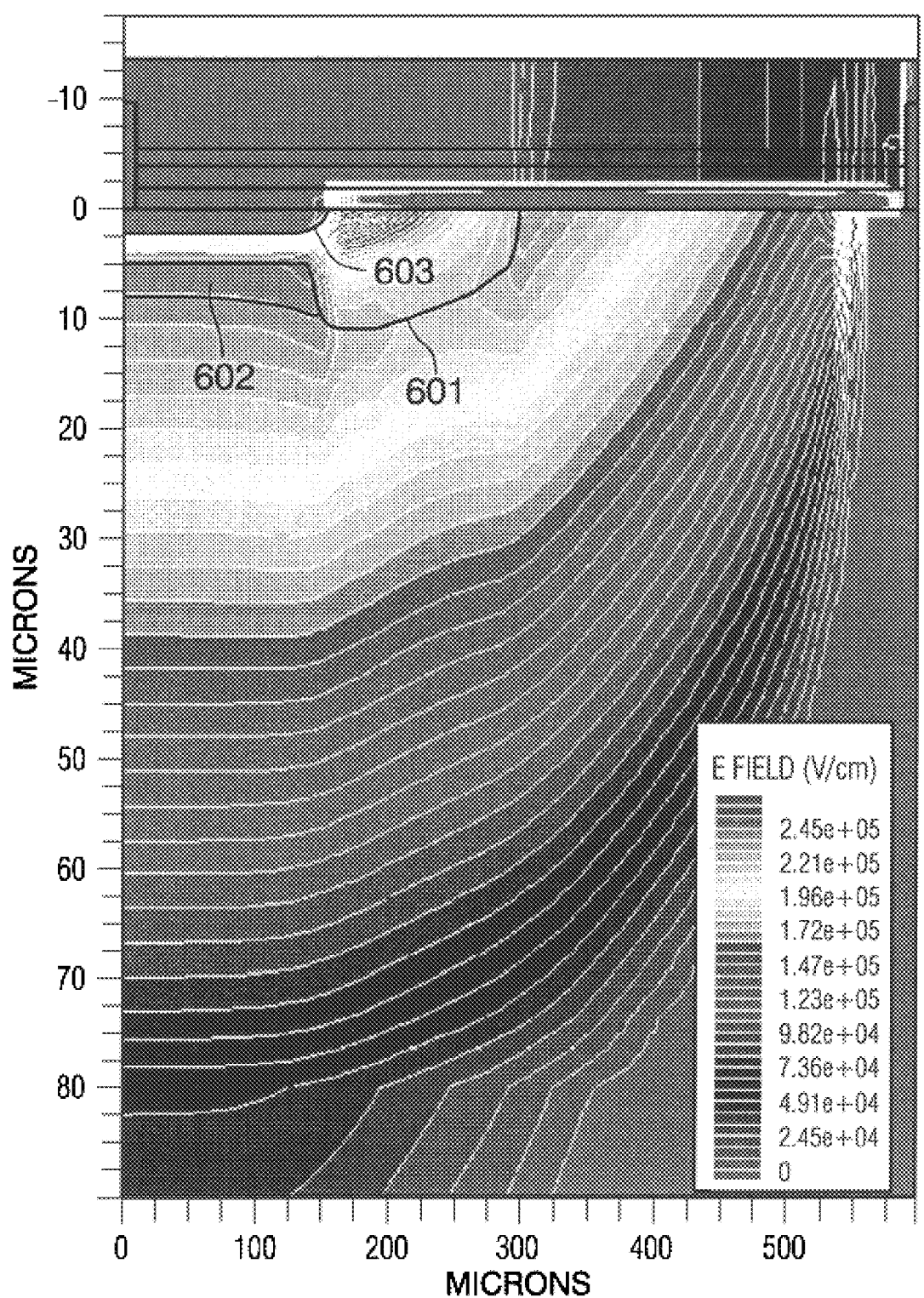
FIGS. 6 and 7 are computer simulations of the electric fields for, respectively, a prior art singly graded junction termination structure and a doubly graded junction n termination structure in accordance with the present invention.

FIG. 1 schematically depicts a prior art semiconductor die 100, whose N-doped upper layer 101 includes an active region well 102 and a JTE region 103, both P-doped. The dopant density level in JTE region 103 is depicted as constant. It is recognized that the conductivity types of the dopants in layer 101, well 102, and JTE region 103, N, P, and P, respectively, can also be of the opposite conductivity types, i.e., P, N, and N, respectively.

Also shown in FIG. 1 are metal contact 104 and dielectric layer 105 overlying, respectively, active region 102 and JTE region 103. Metal contact 104 and dielectric layer 105 are also included in dies 200–500, as depicted in FIGS. 2–5.

FIGS. 2 and 3 illustrate prior art semiconductor dies 200 and 300, each including N-doped upper layer 101 and P-doped well 102 in addition to JTE regions 203 and 303, respectively, both of which are characterized by decreasing dopant density with increasing distance from the active region. JTE region 203 in die 200 decreases in discrete steps 204, while JTE region 303 in die 300 decreases in a substantially smooth gradient 304.

It is known that, for optimum field reduction, the JTE region should be somewhat deeper than the junction of the active area of the device. However the difference in depth of the active area and the JTE produces a high field region at their intersection, which can result in curvature of the junction and consequent locally reduced breakdown voltage.

In FIG. 4 is depicted a semiconductor die 400 of the present invention, which comprises an N-doped upper layer 101 that includes an active region well 102 and a JTE region 403, both P-doped. As with the prior art, the conductivity types shown for die 400 in FIG. 4 can be reversed, P for N and N for P. From a point of maximum dopant density 404 that lies substantially directly beneath the junction of JTE region 403 with active region well 102 at the upper surface of upper layer 101, the dopant density forms a smooth gradient 405 in the direction extending away from well 102 and a second smooth gradient 406 extending beneath well 102.

FIG. 5 illustrates a second preferred embodiment of the present invention, a semiconductor die 500 comprising an N-doped upper layer 101 that includes an active region well 102 and a JTE region 503, both P-doped. As with the prior art, the conductivity types shown for die 500 in FIG. 5 can be reversed, P for N and N for P. From a point of maximum dopant density 504 that lies substantially directly beneath the junction of JTE region 503 with active region well 102 at the upper surface of upper layer 101, the dopant density forms a gradient 505 containing discrete steps in the direction extending away from well 102 and a second gradient 506, also containing discrete steps, extending beneath well 102.

The JTE regions 403 and 503 of dies 400 and 500, respectively, are preferably formed by implanting varying amounts of dopant according to known procedures described in, for example, the previously discussed U.S. Pat. Nos. 4,927,772, 4,667,393, and 4,648,174. The JTE regions 403 and 503 can also comprise epitaxial layers, as described in the previously mentioned U.S. Pat. No. 5,712,502.

FIG. 6 depicts a computer simulation of the electric field for the prior art die 300, whose JTE region decreases in a single smooth gradient. For die 300, the junction 601 is characterized by sharp curvature, and high field region 602 approaches active area 603.

Figure 7:
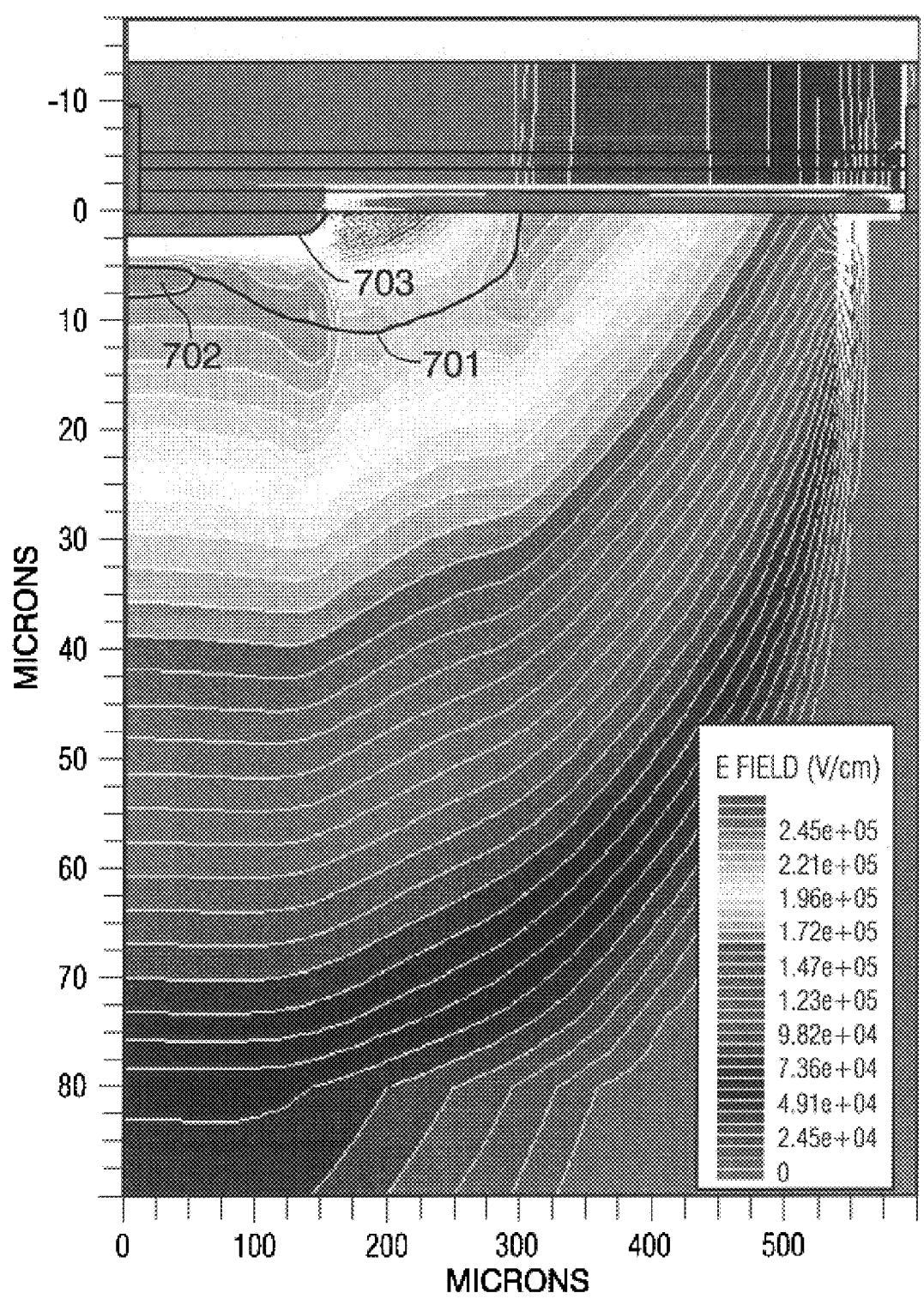

FIG. 7 shows a computer simulation of the electric field for die 400 of the present invention, whose JTE region is defined by two smooth gradients. For die 400, the curvature of junction 701 is much more gradual than that of junction 601 in FIG. 6, and high field region 702 is substantially removed from active area 703.

While the invention has been particularly shown and described with reference to preferred embodiments thereof, it will be understood by those skilled in the art that the foregoing and other changes in form and details may be made therein without departing from the spirit and scope of the invention, which is defined by the following claims.

What is claimed:

1. A silicon semiconductor die comprising:

a heavily doped silicon substrate; and an upper layer comprising doped silicon of a first conductivity type disposed on said substrate, said upper layer having an upper surface and including an active region that comprises a well region of a second, opposite conductivity type and an edge passivation zone that comprises a junction termination extension (JTE) region, said region comprising portions extending away from and extending beneath said well region;

wherein said JTE region is of varying dopant density, said dopant density being maximum in a region directly beneath the junction at said upper surface of said upper layer of said JTE region with said well region, said dopant density in said JTE region decreasing in both lateral directions from said maximum, becoming less in both the portions extending away from and beneath said well region.

2. The die of claim 1 wherein said upper layer is an epitaxial layer.

3. The die of claim 1 wherein said first conductivity type is N and said second conductivity type is P.

4. The die of claim 1 wherein said first conductivity type is P and said second conductivity type is N.

5. The die of claim 1 wherein said dopant density in both said portions of said JTE region decreases in discrete steps.

6. The die of claim 5 wherein said dopant density decreases from the region of maximum density in three discrete steps in the portion of said JTE region extending in the lateral direction away from said well region.

7. The die of claim 5 wherein said dopant density decreases from the region of maximum density in three discrete steps in the portion of said JTE region extending in the lateral direction beneath said well region.

8. The die of claim 1 wherein said dopant density in both said portions of said JTE region decreases in a substantially smooth gradient.

9. The die of claim 1 wherein said JTE region is formed by ion implantation.

10. The die of claim 9 wherein said ion implantation is carried out at more than one dopant level.

11. The die of claim 1 wherein said JTE region is formed by epitaxial growth.

* * * * *